(12) United States Patent
Li et al.

(10) Patent No.: US 12,027,636 B2
(45) Date of Patent: Jul. 2, 2024

(54) PROTECTION COATING FOR SOLAR CELL WAFERS

(71) Applicant: MAXEON SOLAR PTE. LTD., Singapore (SG)

(72) Inventors: Ruihua Li, Cupertino, CA (US); Yafu Lin, San Jose, CA (US)

(73) Assignee: MAXEON SOLAR PTE. LTD., Singapore (SG)

( * ) Notice: Subject to any disclaimer, the term of this patent is extended or adjusted under 35 U.S.C. 154(b) by 89 days.

(21) Appl. No.: 17/527,285

(22) Filed: Nov. 16, 2021

(65) Prior Publication Data

US 2022/0158012 A1     May 19, 2022

Related U.S. Application Data

(60) Provisional application No. 63/115,989, filed on Nov. 19, 2020.

(51) Int. Cl.
*H01L 31/18* (2006.01)
*H01L 31/0216* (2014.01)
*H01L 31/0224* (2006.01)
*H01L 31/0463* (2014.01)
*H01L 31/049* (2014.01)

(52) U.S. Cl.
CPC ...... *H01L 31/049* (2014.12); *H01L 31/02167* (2013.01); *H01L 31/022466* (2013.01); *H01L 31/0463* (2014.12); *H01L 31/18* (2013.01)

(58) Field of Classification Search
CPC ............................ H01L 31/18; H01L 31/1852
See application file for complete search history.

(56) References Cited

U.S. PATENT DOCUMENTS

| | | | | |
|---|---|---|---|---|
| 5,541,139 A | * | 7/1996 | Rijpers | H01L 33/44 438/26 |
| 8,647,410 B2 | | 2/2014 | Borenstein et al. | |
| 2009/0000656 A1 | | 1/2009 | Shembel et al. | |
| 2009/0250109 A1 | * | 10/2009 | Hasegawa | C08K 5/1515 428/473.5 |
| 2010/0323469 A1 | * | 12/2010 | Borthakur | H01L 21/78 156/941 |
| 2015/0349703 A1 | * | 12/2015 | Morad | H01L 31/049 136/251 |
| 2016/0020353 A1 | * | 1/2016 | Chu | H01L 24/97 257/21 |
| 2017/0200526 A1 | * | 7/2017 | Guo | H01L 31/022425 |
| 2019/0168218 A1 | | 6/2019 | Gaio et al. | |
| 2022/0270925 A1 | * | 8/2022 | Bulovic | H01L 31/048 |

FOREIGN PATENT DOCUMENTS

KR    10-2008-0020057 A    3/2008
WO       2015/183827 A2    12/2015

* cited by examiner

*Primary Examiner* — Sadie White
(74) *Attorney, Agent, or Firm* — Schmidt Patent Law, Inc.

(57) ABSTRACT

A solar module includes solar cells that are encapsulated. A back layer is disposed towards back sides of the solar cells and a transparent layer is disposed towards front sides of the solar cells. A protection coating is formed on a surface of the solar cells. The protection coating can be continuous or have a pattern with cutouts that expose the surface of the solar cells.

9 Claims, 12 Drawing Sheets

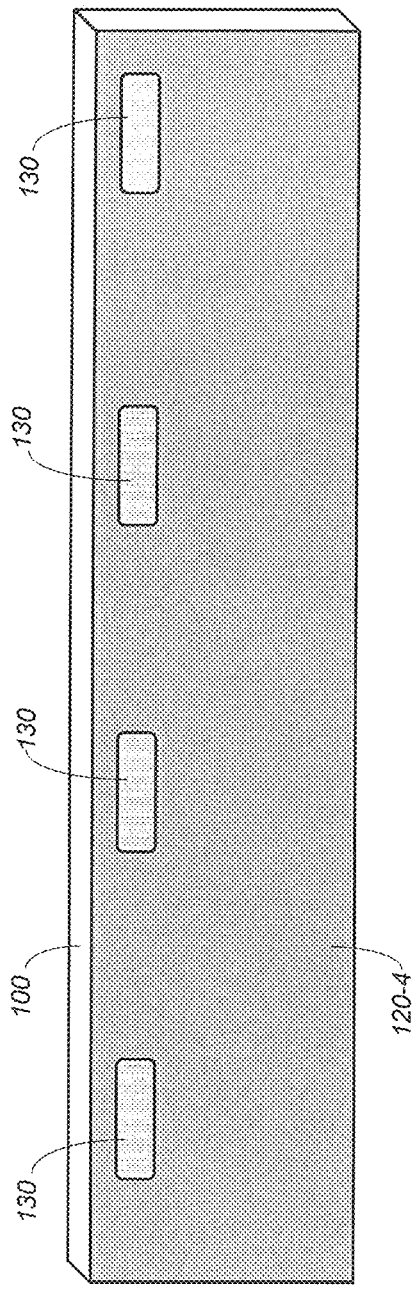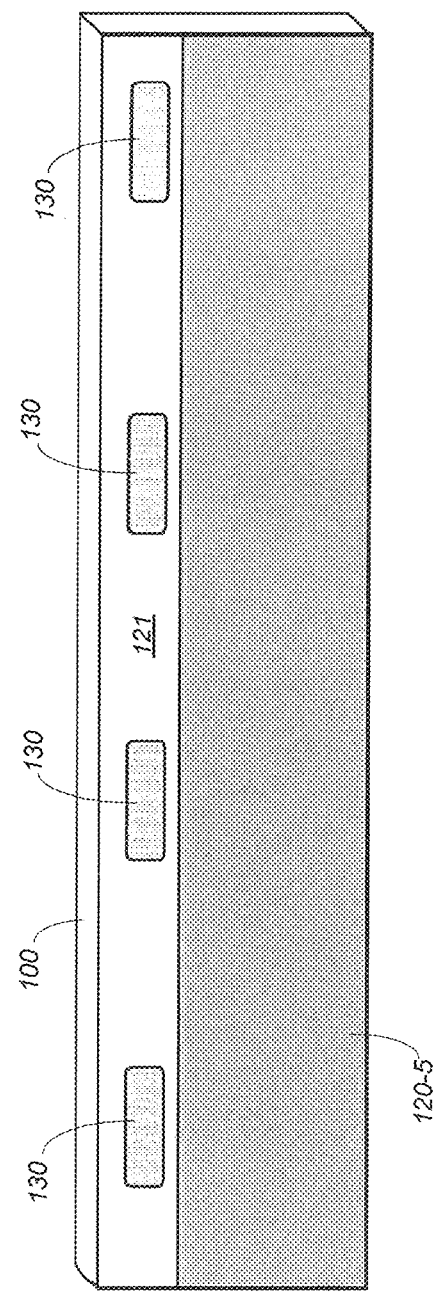

SHINGLING

PROTECTION COATING FOR SOLAR CELL WAFERS

CROSS-REFERENCE TO RELATED APPLICATION

This application claims the benefit of U.S. Provisional Application No. 63/115,989, filed on Nov. 19, 2020, which is incorporated herein by reference in its entirety.

TECHNICAL FIELD

Embodiments of the subject matter described herein relate to solar cell structures and fabrication processes.

BACKGROUND

Solar cells are well known devices for converting light to electrical energy. A solar cell has a front side that faces the sun during normal operation to collect solar radiation and a back side opposite the front side. Solar radiation received by the solar cell creates electrical charges that may be harnessed to power an external electrical circuit, such as a load.

Solar cells may be fabricated from a silicon wafer. For example, the wafer may be doped, metallized, cleaved, etc. to yield a plurality of solar cells. Individual solar cells may be electrically connected and laminated with other components, such as glass, encapsulant, backsheet, etc., to form a solar module. During fabrication, the wafer is subjected to mechanical stresses that can break and/or damage the wafer.

Embodiments of the present invention pertain to a protection coating that provides protection and mechanical support to solar cell wafers.

BRIEF SUMMARY

In one embodiment, a solar module comprises a plurality of encapsulated solar cells, a back layer that is disposed towards back sides of the solar cells, and a transparent layer that is disposed towards front sides of the solar cells. A protection coating is disposed on a surface of the solar cells. The protection coating may comprise a polymer. The protection coating may be continuous or have a pattern (e.g., mesh) with cutouts that expose the surface of the solar cells.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

FIGS. 5-14 show solar cell wafers with protection coatings of various designs in accordance with embodiments of the present invention.

DETAILED DESCRIPTION

In the present disclosure, numerous specific details are provided, such as examples of structures, components, materials, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

To reduce fabrication cost and increase power generation, solar cell wafers are becoming larger and thinner. For example, whereas a typical currently-available solar cell wafer has dimensions of about 158.75 mm×158.75 mm, next generation solar cell wafers will have dimensions of about 180 mm×180 mm to 220 mm×220 mm. Unfortunately, a solar cell wafer becomes more fragile as it becomes larger and thinner. As will be more apparent below, embodiments of the present invention provide a protection coating that may be applied on a surface of a solar cell wafer to provide mechanical support and protection during fabrication. In some embodiments, the protection coating protects the active surface of the wafer and increases the mechanical performance of the wafer.

As can be appreciated, the figures of the present disclosure are not drawn to scale due to large differences in dimensions between the described structural components. Component dimensions are exaggerated in the figures for clarity of illustration.

Figure 1:
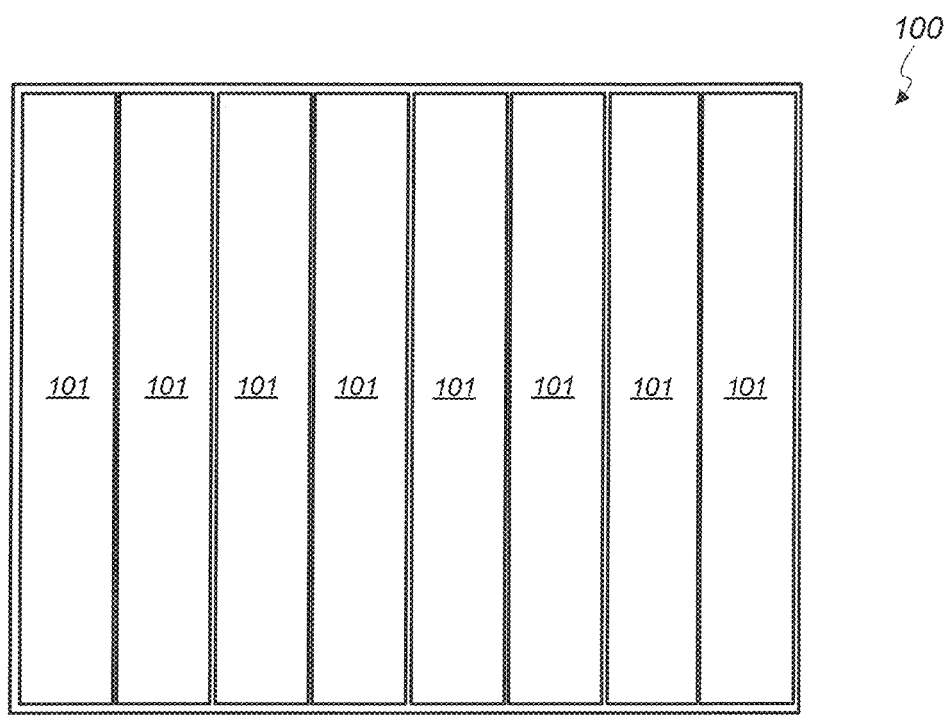
FIG. 1 shows a plan view of a front side of a solar cell wafer in accordance with an embodiment of the present invention.

FIG. 1 shows a plan view of a front (i.e., light-receiving) side surface of a solar cell wafer 100 in accordance with an embodiment of the present invention. In the following description, components on the front side surface of the wafer 100 are referred to as being front-side components, and components on the back side surface of the wafer 100 are referred to as being back side or rear side components.

In the example of FIG. 1, a plurality of solar cells 101 may be obtained from the wafer 100. Eight solar cells 101 are shown in FIG. 1 for illustration purposes. As can be appreciated, the number of solar cells that can be obtained from a solar cell wafer will depend on the size of the wafer, the particulars of the solar cells, and/or other factors. The wafer 100 is illustrated as having a rectangular shape, but may also have a pseudo-square, square, or other shape.

In one embodiment, the solar cells 101 have a diode structure. For example, the front side of the wafer 100 may have an N-type layer that forms a P-N junction with a P-type layer on the back side of the wafer 100. The wafer 100 may have metallization for electrically connecting to the P-type layer and the N-type layer (e.g., front and/or rear metallization patterns). The wafer 100 may be cleaved along scribe lines to yield strips of solar cells 101, which can be shingled together to form a hypercell, such as described in PCT International Publication No. WO 2015183827 A2, for example. As can be appreciated, embodiments of the present invention are applicable to other solar cell structures and shapes.

Figure 2:
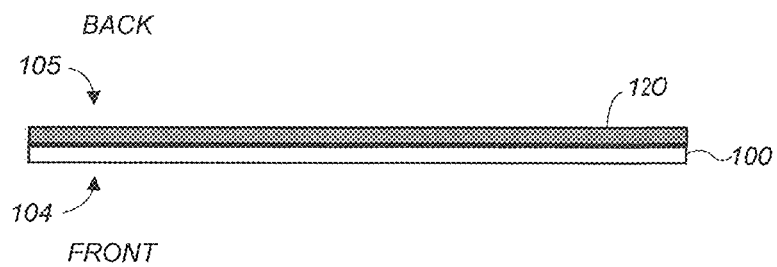
FIGS. 2-4 show side-cross-sectional views of a solar cell wafer that has a protection coating in accordance with an embodiment of the present invention.
Figure 3:
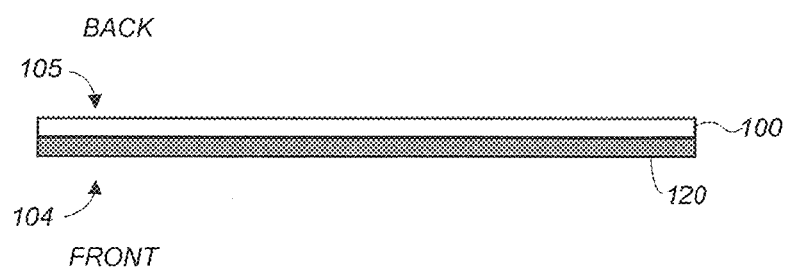

FIGS. 2 and 3 show side-cross-sectional views of the wafer 100 in accordance with an embodiment of the present invention. In one embodiment, the wafer 100 comprises monocrystalline silicon. The wafer 100 may be at the stage of fabrication process just before the cleaving step, i.e., before the wafer 100 is cut to individual solar cells 101. That is, the solar cells 101 have completed P-type and N-type layers that form a P-N junction, metallization, and other structures, which are not shown for clarity of illustration.

A protection coating may be formed on an outermost surface of a solar cell or solar cell wafer. In the example of FIG. 2, a protection coating 120 is formed on the back side (see arrow 105) surface of the wafer 100. The protection coating 120 may also be formed on the front side (see arrow 104) surface of the wafer 100 as illustrated in FIG. 3. The protection coating 120 may be formed on the side of the wafer 100 that will be subjected to handling during fabrication. For example, in a fabrication process where the back side of the wafer 100 will be picked up by a suction arm or other handling apparatus, the protection coating 120 may be formed on the back side of the wafer 100 as in FIG. 2. In the following description, unless otherwise specifically noted, the protection coating 120 may be formed on the back side, the front side, or both sides of the wafer 100.

The protection coating 120 provides mechanical support and protection to the wafer 100 during handling and processing. In one embodiment, the protection coating 120 is a dielectric and comprises a polymer. The protection coating 120 may comprise a thermoset material, such as epoxy, acrylate, silicone and the like. In some embodiments, a thermoplastic material (e.g., polyurethane, polyester) may be employed in cases where the solar cells 101 will not be exposed to temperatures that will cause the thermoplastic material to remold. A protection coating 120 comprising a thermoset material may be cured by ultraviolet (UV) light, electron beam, gamma radiation, etc. A protection coating 120 comprising a thermoplastic material may be formed to shape after temperature cool down or after the solvent in the solution has evaporated. In one embodiment, the protection coating 120 is fruited to a thickness of 5-100 μm.

The protection coating 120 may be formed on a surface of the wafer 100 before the wafer 100 is cut to individual solar cells 101. The protection coating 120 may be applied by spray coating, spin coating, stencil/screen printing, taping, laminating, printing, or other suitable coating process. Generally, the process for applying and curing the protection coating 120 depends on its material and may be performed in accordance with recommendations from the vendor of the material.

When formed on the front side of the wafer 100, the protection coating 120 may comprise a material that is transparent and has good UV protection. A protection coating 120 that is formed on the back side of the wafer 100 has fewer optical requirements. For example, a protection coating 120 formed on the back side of the wafer 100 may comprise a material that is transparent, opaque, or translucent. Bifacial solar modules may require a protection coating 120 that is transparent.

Figure 4:

The protection coating 120 may be formed on the wafer 100 to have a substantially smooth, planar surface as illustrated in FIGS. 2 and 3. The protection coating 120 may also be formed on the wafer 100 to have a rough surface as illustrated in the side cross-sectional view of FIG. 4. The rough surface can advantageously increase friction to prevent slippage during handling.

A protection coating 120 may be a continuous layer (i.e., has no pattern), a plurality of separate layers, or have a pattern with cutouts (e.g., alternating regions with and without the coating). The protection coating 120 may be formed on the entire or selected surface of the wafer 100. In the following descriptions, the protection coating 120 is given different labels, namely 120-1, 120-2, etc. to distinguish between different protection coating designs.

Figure 5:
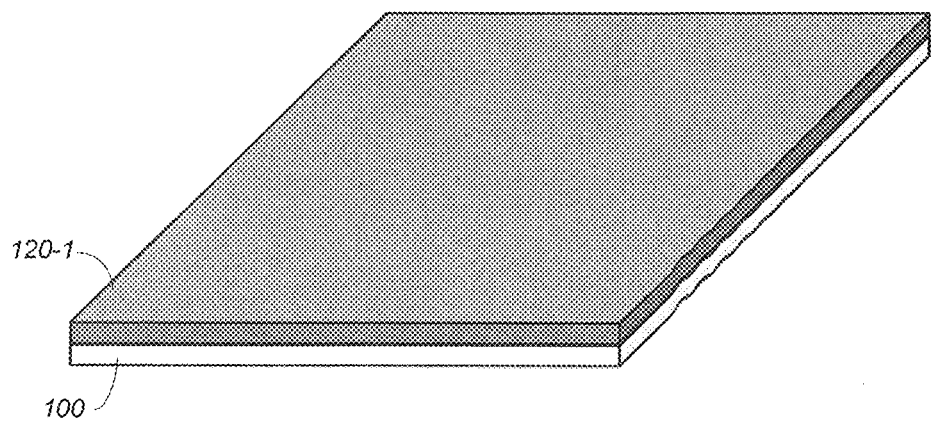

FIG. 5 shows a perspective view of the wafer 100 with a protection coating in accordance with an embodiment of the present invention. In the example of FIG. 5, a protection coating 120-1 is formed as a continuous layer on an entire surface of the wafer 100 except on electrical contact areas, such as areas where electrically conductive adhesives (ECA) are formed. As will be more apparent below, a protection coating 120 may also be formed in selected areas on the surface of the wafer 100.

A protection coating 120 may be patterned using masking or direct deposition techniques, for example. Patterning the protection coating 120 removes portions of the protection coating 120 to form cutouts through which the wafer 100 is exposed. The cutouts advantageously require less protection coating material, thereby lowering fabrication cost and minimizing the weight added by the protection coating 120 on the wafer 100.

Figure 6:
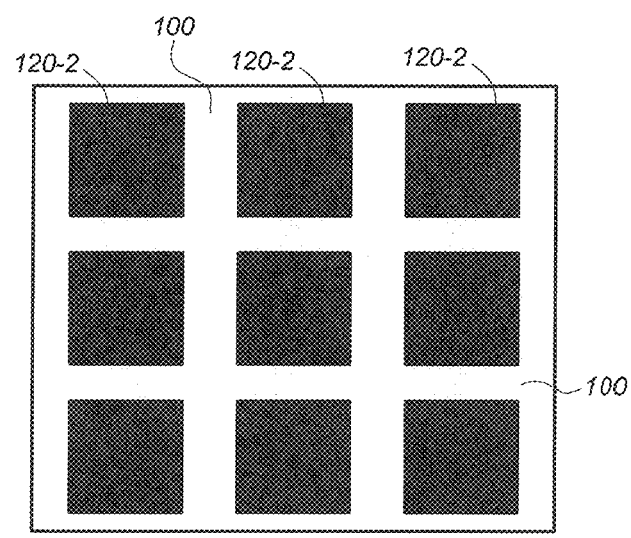

FIG. 6 shows a plan view of the wafer 100 with a plurality of protection coatings or coating regions in accordance with another embodiment of the present invention. In the example of FIG. 6, each protection coating 120-2 is a relatively small (compared to the dimensions of the wafer 100) rectangular layer. A plurality of protection coatings 120-2 is arranged on a surface of the wafer 100 such that there is a space between adjacent protection coatings 120-2 that exposes the surface of the underlying wafer 100.

Figure 7:
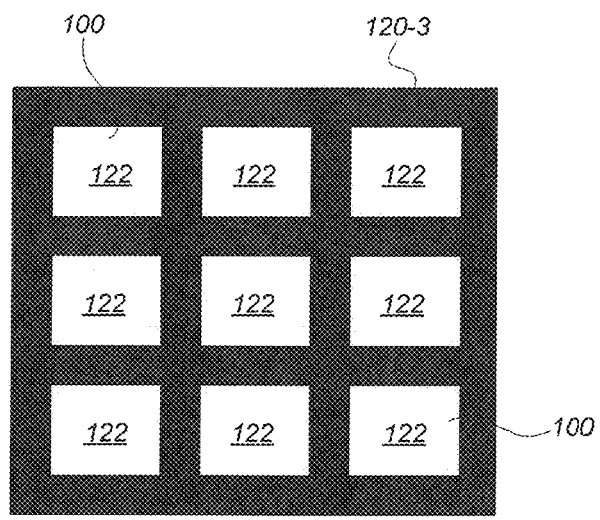

FIG. 7 shows a plan view of the wafer 100 with a protection coating in accordance with another embodiment of the present invention. In the example of FIG. 7, a protection coating 120-3 is a layer that has a plurality of rectangular cutouts 122 that expose the surface of the underlying wafer 100.

FIGS. 8-14 show perspective views of a strip of a solar cell 101 or a portion of the wafer 100 with protection coatings of various patterns in accordance with embodiments of the present invention. FIGS. 8-14, which show a single solar cell strip for clarity of illustration, provide example protection coating patterns for accommodating adhesive bonding regions for interconnecting the solar cells.

In the example of FIG. 8, a protection coating 120-4 covers the entire surface of the solar cell 101 or wafer 100 except in areas where contact structures 130 are formed. A contact structure 130 provides a surface for making an electrical connection to a solar cell. In one embodiment, a contact structure 130 comprises a contact pad and an electrically conductive adhesive (ECA) formed on top of the contact pad. The protection coating 120-4 is formed all the way to the edge of the solar cell (to help prevent shunting) but around the contact structures 130.

In the example of FIG. 8, a top-down view of a rear surface of solar cell 101 comprises a plurality of contact structures 130 extending along an interconnect bond line adjacent to the solar cell edge. The "interconnect bond line" can be used herein to refer to a region between terminals of adjacent shingled solar cells which comprises adhesive bonding regions (e.g., contact structures 130).

Figure 10:
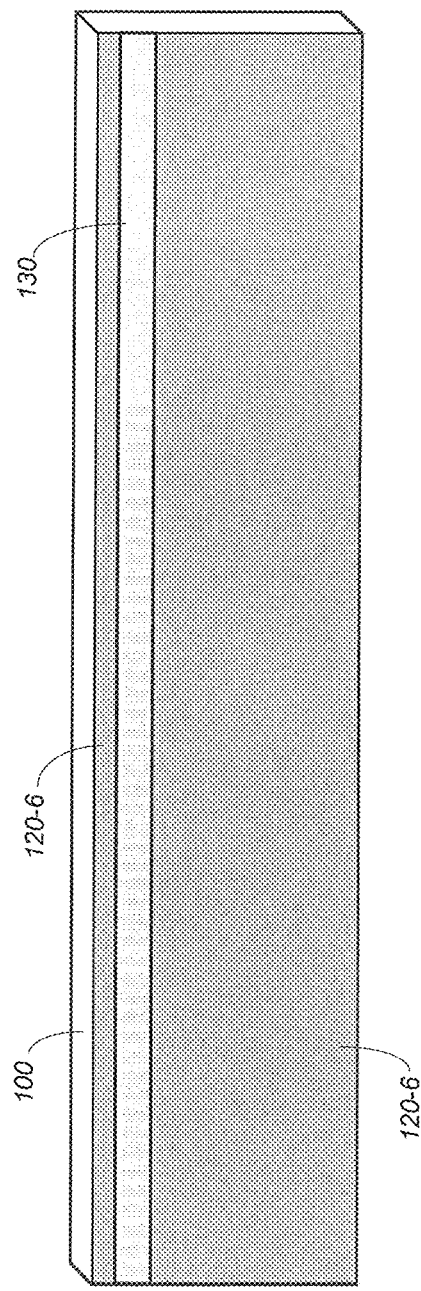

A contact structure 130 may comprise a contact pad that is formed of an electrically conductive material, for example an elemental metal or metal alloy (e.g., aluminum, copper, nickel, silver, gold). A contact pad, which may be formed by surface printing, may be substantially planar. A contact pad may also have a coarse or roughened surface. In the example of FIG. 8, four contact structures 130 are depicted. However any suitable number of contact structures 130 can be provided. For example, in some embodiments, a single contact structure 130 is provided as shown in FIG. 10. The contact pads of the contract structures 130 depicted in FIG. 8 are substantially rectangular. However the contact pads can be provided in any desired shape.

Generally speaking, a protection coating is thinner than a contact structure. This allows the contact structure to protrude through the protection coating and make an electrical connection to an electrical circuit or another solar cell. For example, a protection coating may have a thickness of about 5-100 μm in an embodiment where the contact structure has a thickness of about 40-130 μm as long as the contact structure is thicker than the coating thickness.

In the example of FIG. 9, a protection coating 120-5 is a single, continuous layer that only partially covers the wafer 100. Areas that have a plurality of contact structures 130 are not covered by the protection coating 120-5. In the example of FIG. 9, the protection coating 120-5 does not cover a rectangular area 121 on the surface of the wafer 100 that has a plurality of contact structures 130. The protection coating 120-5 is formed away from, rather than around, the contact structures 130.

In the example of FIG. 10, instead of having a plurality of elliptical or dot-shaped contact structures 130 at an edge, the solar cell has a single longitudinal contact structure 130 at the edge. In this case, a protection coating 120-6 is formed on the entire surface of the wafer 100 all the way to the edge of the solar cell except in an area where there is a longitudinal contact structure 130.

Figure 11:
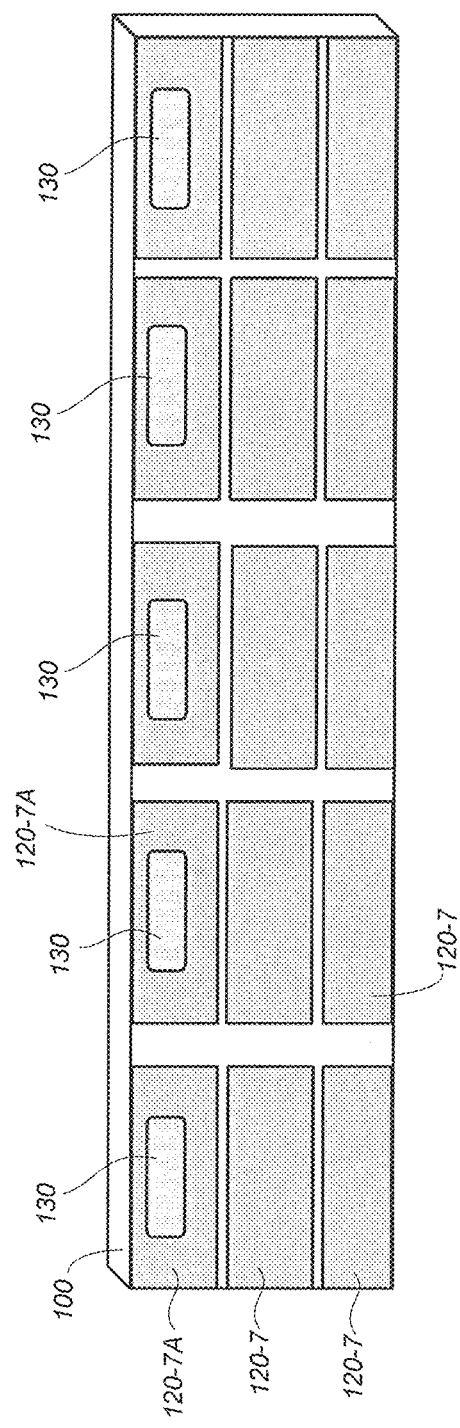

In the example of FIG. 11, a plurality of protection coatings 120-7 is arranged on the surface of the wafer 100 such that there is a space that exposes the wafer 100 between adjacent protection coatings. A protection coating 120-7 that goes over a contact structure 130 has a cutout through which the contact structure 130 protrudes (see 120-7A).

Figure 12:
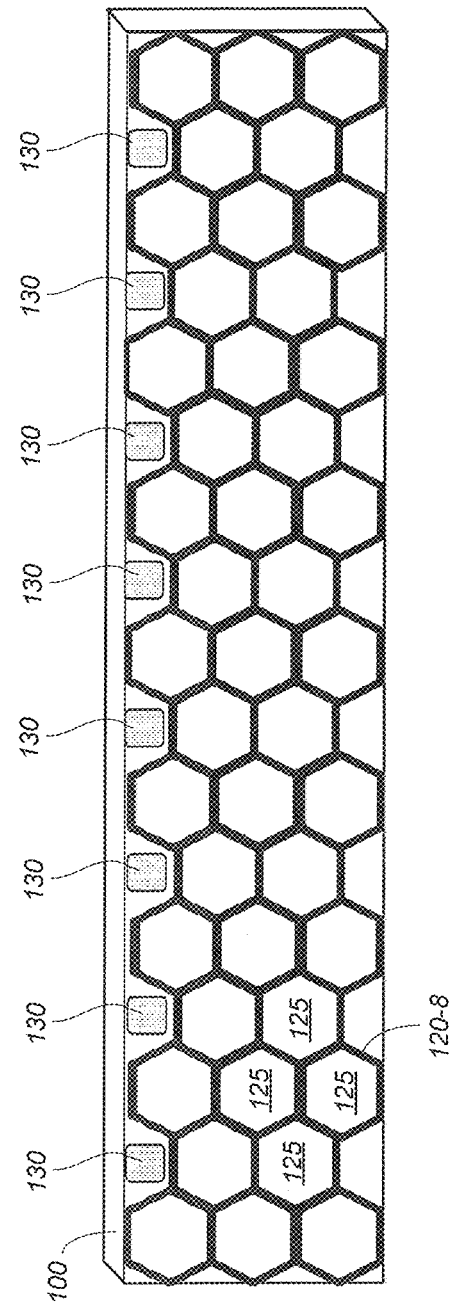

In the example of FIG. 12, a protection coating 120-8 with a mesh pattern is formed on the surface of the wafer 100. The protection coating 120-8 has hexagonal (either full or half) cutouts 125 that expose the surface of the wafer 100 and the contact structures 130. The mesh pattern of the protection coating 120-8 is also referred to as a honeycomb.

Figure 13:
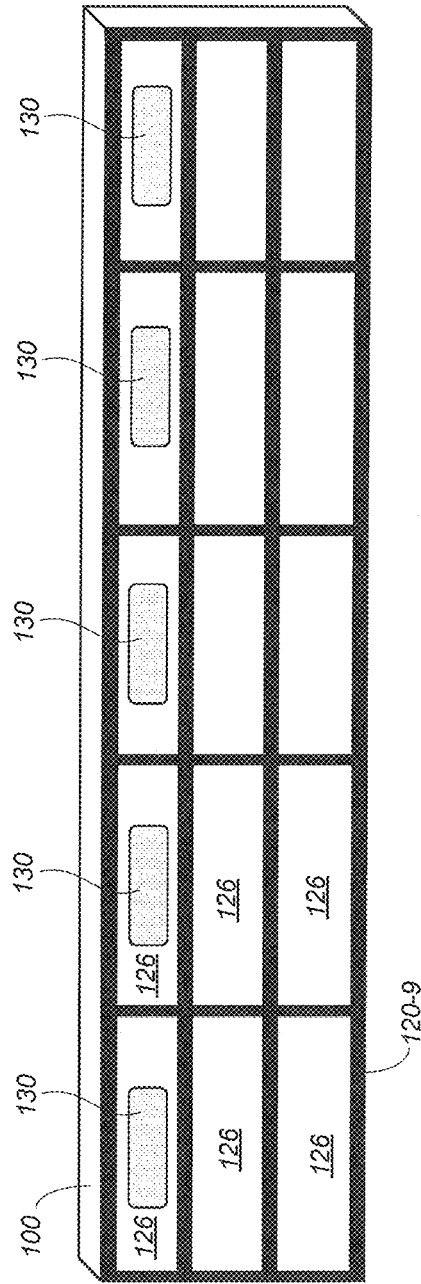

In the example of FIG. 13, a protection coating 120-9 with another mesh pattern is formed on the surface of the wafer 100. The protection coating 120-9 has rectangular cutouts 126 that expose the surface of the wafer 100 and the contact structures 130.

Figure 14:
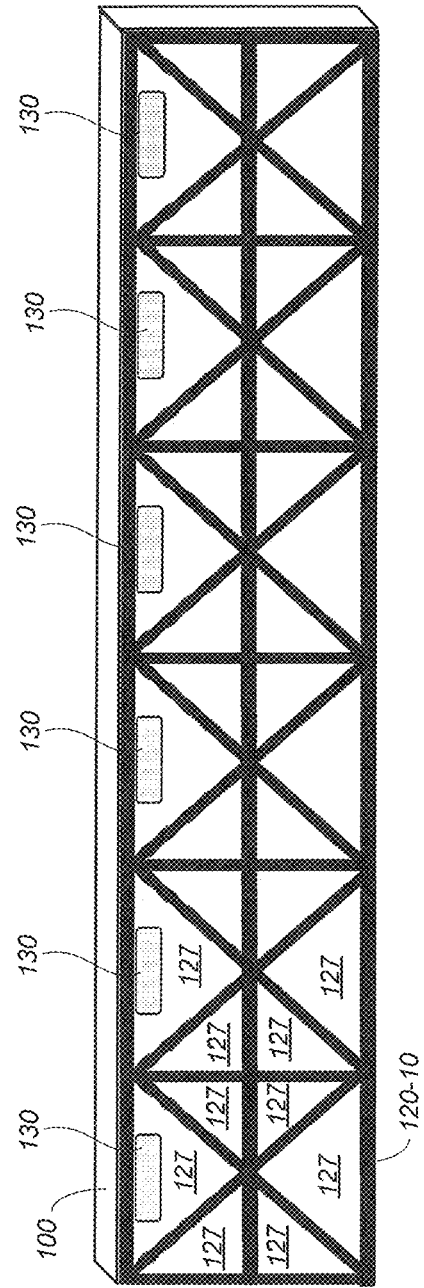

In the example of FIG. 14, a protection coating 120-10 with another mesh pattern is formed on the surface of the wafer 100. The protection coating 120-10 has triangular cutouts 127 that expose the surface of the wafer 100 and the contact structures 130.

FIGS. 15-25 illustrate a method of fabricating a solar module in accordance with an embodiment of the present invention. In the example of FIGS. 15-25, the solar module includes solar cells with a protection coating applied thereon as discussed above.

Figure 15:
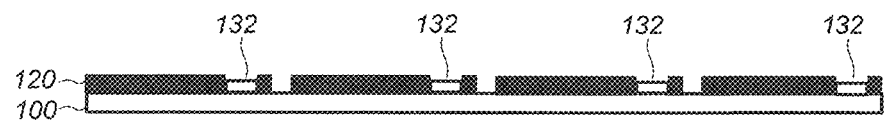
FIGS. 15-25 illustrate a method of fabricating a solar module in accordance with an embodiment of the present invention.

FIG. 15 shows a cross-sectional view of a solar cell wafer 100 in accordance with an embodiment of the present invention. FIG. 15 illustrates a fabrication process step where a protection coating 120 is applied on a surface of the wafer 100. The protection coating 120 may be applied on the front side, backside, or both sides of the wafer 100. In the example of FIG. 15, the protection coating 120 is formed on the same side of the wafer 100 as the contact pads 132 that form contact structures of the individual solar cells. In the example of FIG. 15, the protection coating 120 and the contact pads 132 are formed on the back side of the wafer 100. The protection coating 120 and the contact structures that include the contact pads 132 may also be formed on opposite sides of the wafer 100.

Figure 17:
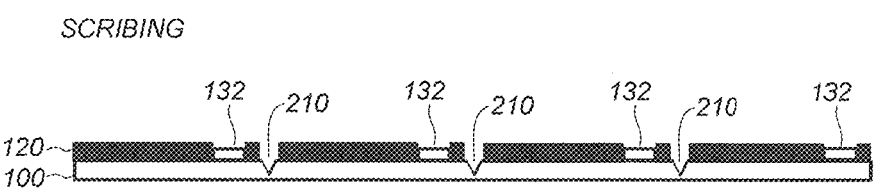

In the example of FIG. 15, the protection coating 120 has a pattern that accommodates scribe lines (see FIG. 17, 210). More particularly, the pattern has cutouts or other design where a laser beam can scribe the wafer 100 without scribing the protection coating 120. The pattern of the protection coating 120 does not have to accommodate scribe lines in embodiments where the scribe lines and the protection coating 120 are formed on opposite sides of the wafer 100.

Figure 16:
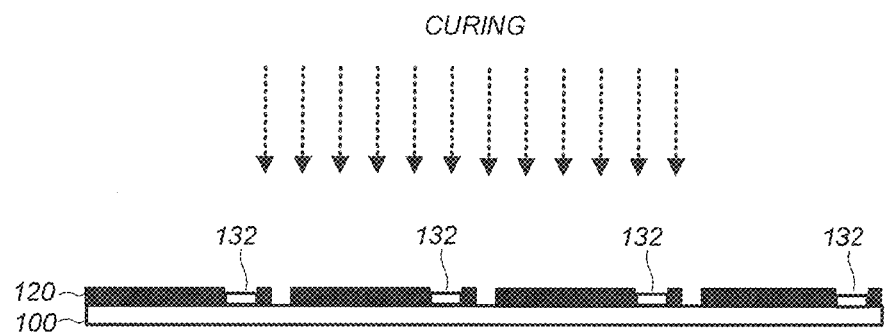

FIG. 16 shows a cross-sectional view that illustrates curing the protection coating 120.

FIG. 17 shows a cross-sectional view that illustrates scribing the wafer 100. The scribing step may be performed by scanning a laser beam on the wafer 100 to form scribe lines 210 thereon. The scribe lines 210 facilitate cleaving of the wafer 100 in a subsequent process step to separate the individual solar cells 101. In the example of FIG. 17, the scribe lines 210 and the protection coating 120 are on the back side of the wafer 100. The laser beam used for scribing should not scribe the protection coating 120. When the protection coating 120 is on the same side as the scribe lines 210, the protection coating 210 may have a pattern that does not cover the area where the scribe lines 210 are formed.

Figure 18:
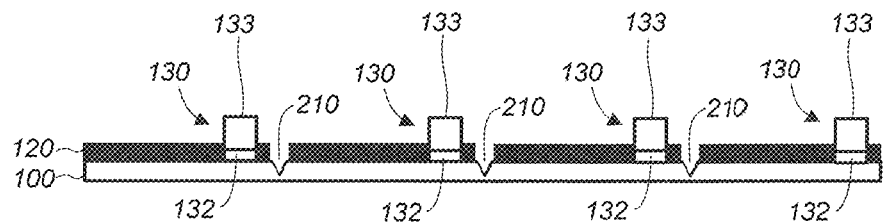

FIG. 18 shows a cross-sectional view that illustrates forming an ECA layer 133 on the contact pads 132 to form the contact structures 130. For illustration purposes, FIG. 18 shows the contact structures 130 and the protection coating 120 being formed on the same side of the wafer 100, with the protection coating 120 having a design that accommodates the contact structures 130. The protection coating 120 and the contact structures 130 may also be formed on opposite sides of the wafer 100.

Figure 19:
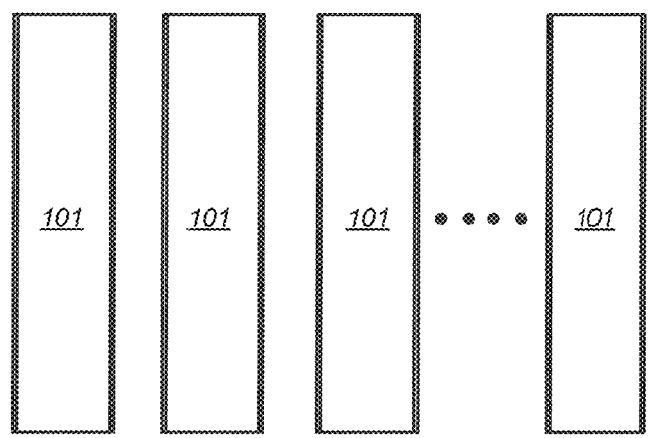

FIG. 19 is a plan view that illustrates cleaving the wafer 100 to produce the individual strips of solar cells 101. The wafer 100 may be cleaved along the scribe lines 210 (shown in FIGS. 17 and 18). For example, the wafer 100 may be flexed against a curved surface along the scribe lines 210. The protection coating 120 and the contact structures 130 are not shown in FIG. 19 for clarity of illustration.

Figure 20:
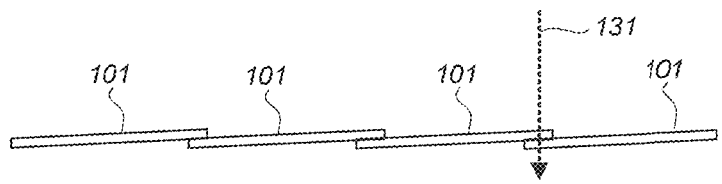
Figure 21:
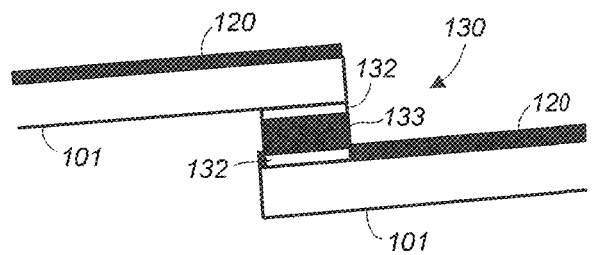

FIGS. 20 and 21 are side-views that illustrate shingling the solar cells 101. In one embodiment, the shingling step electrically connects the solar cells 101 in series to form a hypercell or a series-connected string of solar cells. As shown in FIG. 20, in the shingling step, the solar cells 101 are arranged to overlap at corresponding contact structures 130 (see FIG. 20, arrow 131; FIG. 21) along a bond line.

FIG. 21 shows an enlarged view of overlapping portions of shingled solar cells 101. Each solar cell 101 may have contact pads 132 that electrically connect to corresponding P-type or N-type layer of the solar cell 101. An ECA layer 133 is placed between contact pads 132 of overlapping solar cells 101. The protection layer 120 of the solar cells 101, when formed on the same side as the contact structures 130, may have cutouts or other designs that allow the contact structures 130 to protrude.

FIGS. 22-25 show cross-sectional views that illustrate incorporation of the shingled solar cells 101 as part of a solar module.

Figure 22:
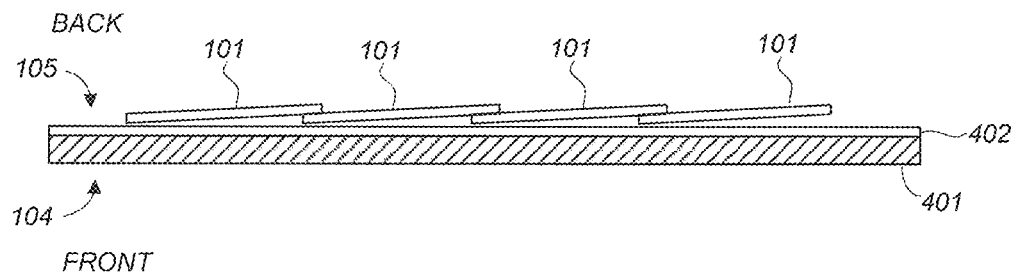

In FIG. 22, a sheet of encapsulant 402 is placed on a transparent layer 401, which in one embodiment comprises glass. The solar cells 101, in turn, are placed on the sheet of encapsulant 402. The solar cells 101 may be stacked before being placed between encapsulants. In one embodiment, the front sides (see arrow 104) of the solar cells 101 are facing the encapsulant 402 and the transparent layer 401.

Figure 23:
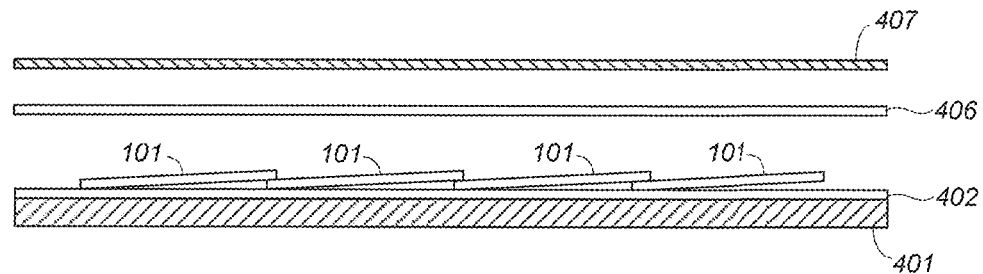

In FIG. 23, a sheet of encapsulant 406 is placed on the back sides of the solar cells 101 and, in turn, a back layer 407 is placed on the encapsulant 406. The encapsulant 402 and 406 may comprise silicone, ethylene vinyl acetate (EVA), polyolefin elastomer (POE), or other suitable encapsulant commonly employed in the photovoltaic industry. The encapsulants 402 and 406 are described herein as sheets for illustration purposes. The encapsulants 402 and 406 may also be a liquid encapsulant. Similarly, the back layer 407 may comprise a backsheet commonly employed in the photovoltaic industry, such as glass or plastic film. The back layer 407 is disposed towards the back sides of the solar cells 101, whereas the transparent layer 401 is disposed towards the front sides of the solar cells 101.

Figure 24:
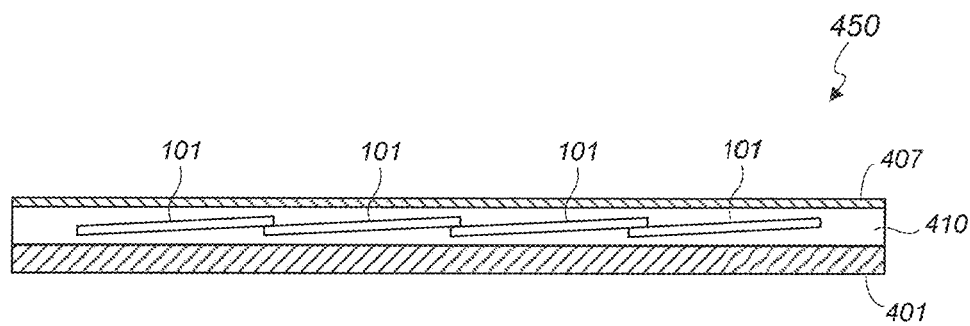
Figure 25:
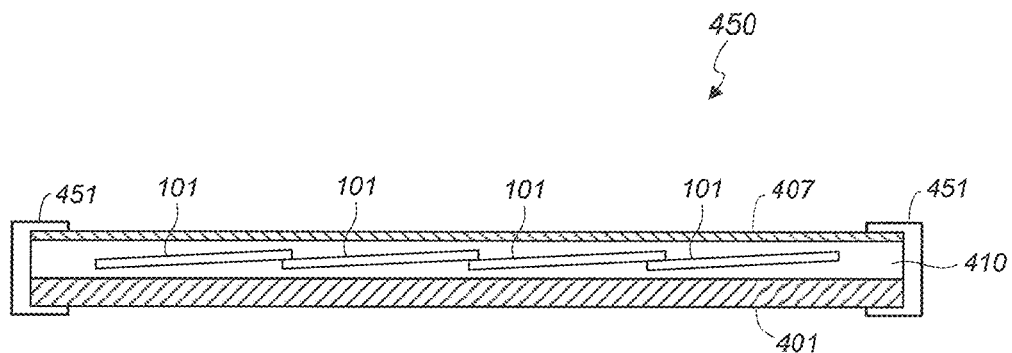

In FIG. 24, the transparent layer 401, the encapsulant 402, the shingled solar cells 101, the encapsulant 406, and the back layer 407 are laminated to form a solar module 450. In the example of FIG. 24, the label "410" represents the encapsulants 402 and 406 after lamination. The lamination may be performed by inserting the aforementioned components, as arranged in FIG. 23, in a lamination machine. In the example of FIG. 24, the back layer 407 and the transparent layer 401 are the outermost components of the solar module 450. As shown in FIG. 25, the solar module 450 may include a frame 451 that provides mechanical support to the solar module.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method comprising:
    applying a dielectric polymer coating on a surface of a solar cell wafer, the dielectric polymer coating having a pattern with a plurality of cutouts that expose the surface of the solar cell wafer; and
    after applying the dielectric polymer coating on the surface of the solar cell wafer, cleaving the wafer into a plurality of solar cells,
    wherein the dielectric polymer coating has a mesh pattern.

2. The method of claim 1, wherein the dielectric polymer coating comprises a thermoset material.

3. The method of claim 1, further comprising:
    placing a first sheet of encapsulant on a transparent layer;
    placing the plurality of solar cells on the first sheet of encapsulant;
    placing a second sheet of encapsulant on the plurality of solar cells;
    placing a back layer on the second sheet of encapsulant; and
    laminating the transparent layer, the first sheet of encapsulant, the plurality of solar cells, the second sheet of encapsulant, and the back layer.

4. The method of claim 1, further comprising:
    shingling the plurality of solar cells to interconnect the plurality of solar cells in series.

5. The method of claim 2, wherein the thermoset material comprises epoxy, acrylate, or silicone.

6. The method of claim 1, wherein the dielectric polymer coating has a pattern with one of the plurality of cutouts that exposes an electrical contact area of the solar cell wafer.

7. The method of claim 6, wherein the dielectric polymer coating surrounds the electrical contact area of the solar cell wafer.

8. The method of claim 1, wherein the surface of the solar cell wafer is a front side surface of the solar cell wafer.

9. The method of claim 1, wherein the surface of the solar cell wafer is a back side surface of the solar cell wafer.

* * * * *